United States Patent [19]
Chiron et al.

[11] 3,946,341
[45] Mar. 23, 1976

[54] BROADBAND ELECTROACOUSTIC DELAY LINES

[75] Inventors: Bernard Chiron; Jean Puyhaubert; Michel Seguin, all of Paris Cedex, France

[73] Assignee: Societe Lignes Telegraphiques et Telephoniques, Paris Cedex, France

[22] Filed: Jan. 6, 1975

[21] Appl. No.: 539,032

[52] U.S. Cl................. 333/30 R; 310/8.2; 333/33; 333/72; 333/84 R
[51] Int. Cl.[2].. H03H 9/26; H03H 9/30; H03H 9/32; H01L 41/10
[58] Field of Search............ 333/30 R, 72, 33, 84 R, 333/84 M; 310/8, 8.1, 9.7, 9.8, 8.2

[56] References Cited
UNITED STATES PATENTS
3,745,486   7/1973   Chiron et al..................... 333/30 R Primary Examiner—Alfred E. Smith
Assistant Examiner—Marvin Nussbaum
Attorney, Agent, or Firm—Kemon, Palmer & Estabrook

[57] ABSTRACT

In a broadband microwave acoustic delay line, two or more transducers are used for energy translation from electromagnetic into acoustic (one type) and reverse (the other type) which are mechanically independent and resonant at acoustic frequencies different from one to the others. Each transducer of one type is connected to a first end of a matching section which constitutes a series resonant circuit tuned at a frequency within the band different from the frequency corresponding to any other transducer. The second ends of the two or more matching sections are connected at the same end of a wideband impedance transformer.

2 Claims, 2 Drawing Figures

BROADBAND ELECTROACOUSTIC DELAY LINES

BACKGROUND OF THE INVENTION

The present invention concerns an improved electroacoustic delay line structure based on the propagation of volume acoustic waves in a delay medium excited by transducing means which effect the conversion between electromagnetic energy and acoustic energy and reversely.

The conversion of electromagnetic energy into acoustic energy for the purpose of delaying an electric signal has been utilised in the design of many types of delay lines. One of the disadvantages at present available delay lines resides in their relatively small bandwidth. This selectivity has a number of causes, the two main ones of which are the following: in order that the piezoelectric transducers may have optimum conversion yield they must be so constructed that they behave, mechanically, as a circuit tuned at the frequency of the acoustic wave. As is known, the acoustic impedance is essentially a function of the thickness of the piezoelectric layer of the transducer, measured in wavelength of the acoustic wave. On the other hand, the electrical impedance of the transducer in the microwave band is very low in relation to the standard impedance of the lines (generally 50 ohms) and it is necessary to provide an impedance transformer which often increases selectivity.

From the electrical viewpoint, it is possible to design a more or less complex section which effects a broadband impedance matching of the impedance of the delay line. The latter consists essentially of the capacitance constituted by the two electrodes of the transducer and the piezoelectric dielectric, as well as the impedance (often reactive) of the connecting element between the delay line and the impedance matching section.

The invention relates essentially to a delay line structure whose bandwidth is greater than one octave, at less than 3 dB, and which has an insertion loss similar to that of lines with narrow frequency band.

Prior Art

The problem of broadening the bandwidth of delay lines has been the subject of many publications. There will be mentioned inter alia the article published in the journal "Electronics and Communication in Japan", Volume 55-A, No. 9, 1972, by Messrs YAMAMIZU, CHUBACHI and KIKUCHI, entitled: "Thin-film piezoelectric ultrasonic transducers with divided electrodes", in which the authors describe a transducer consisting at least of the following stack: a counter-electrode disposed on the delay medium, a thin piezoelectric layer (ZnO) and a metallic electrode consisting of four sectors which are mechanically independent of one another and are electrically connected in series. The advantage of this structure resides in that the electrical impedance thus obtained is relatively high, and of the same order of magnitude as that of the microwave transmission lines. Under these conditions, the matching between the transmission line and the delay line is simplified and the bandwidth is increased.

Brief disclosure of the Invention

In accordance with the essential feature of the invention, the delay line includes for each type of energy transformation at least two transducers tuned to different acoustic frequency values comprised within the bandwidth. These transducers are connected to impedance matching sections which are so designed that the resultant impedance is equivalent to that of a series resonating circuit tuned to a frequency value of the band to be transmitted which is different for each transducer and different from that of the acoustic resonance.

In accordance with a subsidiary feature of the invention, each delay line comprises two or more pairs of transducers tuned to different pairs of different values of the acoustic frequency and/or associated with impedance matching sections which meet the aforesaid condition. These transducers are geometrically disposed on the delay medium in such manner that transducers providing the same transformation are mechanically isolated from one another, each of the transducers of one pair being coupled to the other one of the pair through the delay medium. The matching circuits associated with the transducers performing the energy transformation in a given sense are interconnected in parallel from the electrical viewpoint as seen from the transmission line for the transmission of the signal to be delayed.

DETAILED DESCRIPTION OF THE INVENTION

Figure 1:
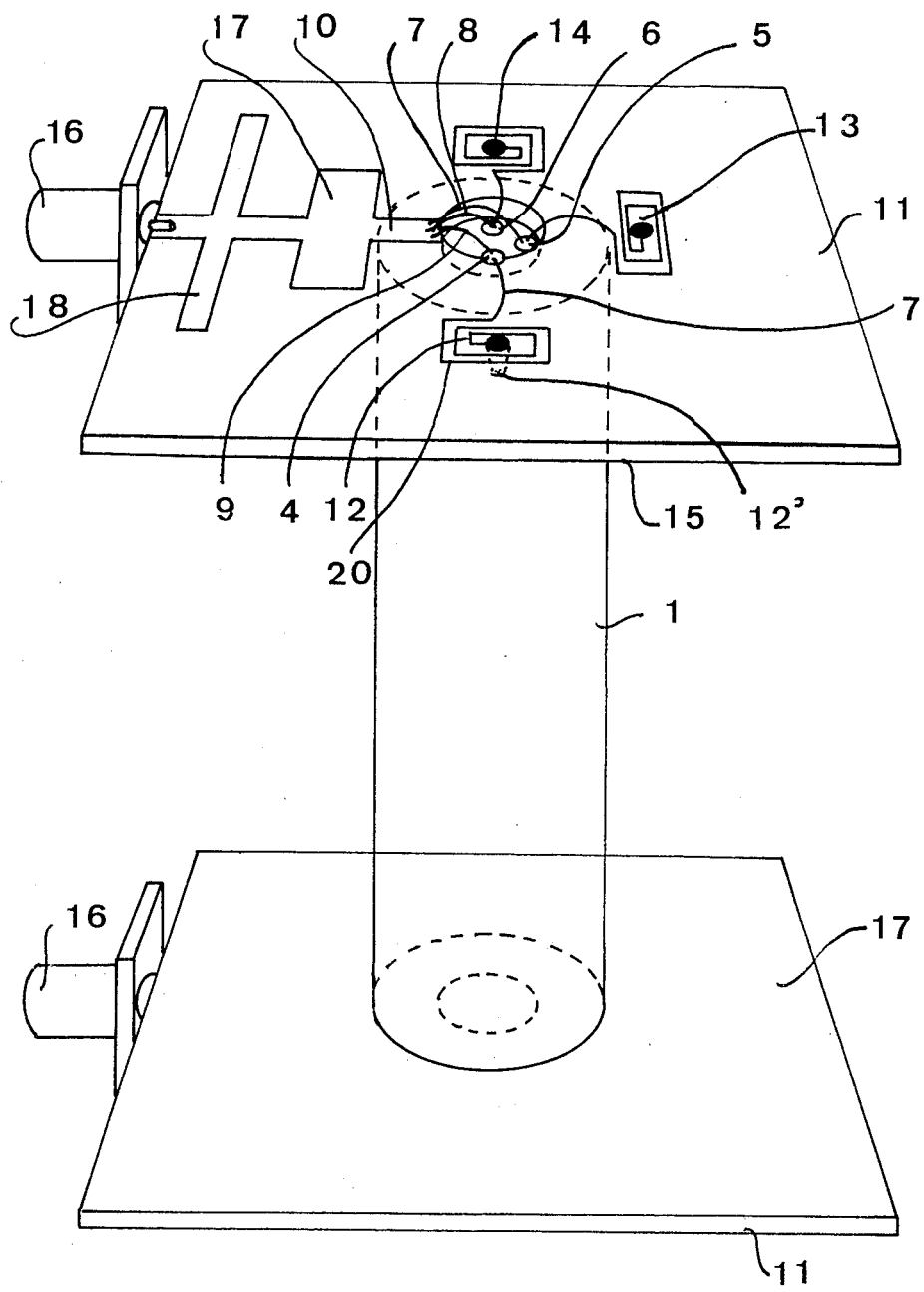

The broadening of the bandwidth in the delay lines according to the present invention is obtained by means of electrical and mechanical circuits tuned to different resonance frequencies, comprised within the operating frequency bandwidth. There is thus obtained an effect similar to that of coupled circuits in electronics, which results in a broadening of the bandwidth. The design of delay lines according to the present invention may be optimised, taking into account the many available parameters, by means of a computer assisted design. The resonance frequencies, which are the parameters available to the designer, are two in number for each transducer, namely the acoustic resonance frequency of the transducer proper and the electrical resonance frequency of the unit comprising the transducer and the matching section. When the delay line comprises more than two transducers for each sense of energy transformation in accordance with a preferred variant of the invention, the designer has available four times more parametes than there are transducer for each transformation. Thus, in the case of a delay line having three pairs of transducers, the designer has available 12 parameters for optimising the line. The equations may be found by a simple calculation of the impedances produced at the various points of the device and is not within the scope of the invention. The resonance frequency values defined by the calculation will also be translated into physical quantities by any person skilled in the art on the basis of his knowledge. For example, it is known that the acoustic resonance frequency of a thin-layer piezoelectric transducer is almost exclusively related to the thickness of this layer, for a given material, the thickness corresponding to one-half the wavelength of the acoustic wave set up at the frequency of the electromagnetic wave. The speeds of propagation of the various modes of propagation in the materials usually employed in the design of the transducers have been measured and have been published (cf. the British journal "Ultrasonics", January 1967 number, page 19, by M.D. BEECHAM). Likewise, the capacity of the transducers may be simply related to its surface, the distance between the two electrodes and the permittivity of the piezoelectric medium which separates them. Similarly, the impedance, including that of the strip by which the transducer is connected to the matching section, is related to the physical parameters (length of the conductor, width, resistivity of the metal).

With regard to the resonance frequency of the transducer-matching circuit unit, it may also be readily related to the technological data of the device. The equivalent impedance of the transducer has formed the subject of a great deal of research. The above Japanese reference contains a mention of the known results and there is to be found notably in FIG. 2 on page 7 the equivalent circuit of the transducer from the electrical viewpoint, as well as the explanation of the various impedances appearing on the equivalent diagram. The physical parameters available to the designer are partially defined by the frequency range in which the device must operate and by certain technological requirements resulting notably from the nature of the delay medium. There may also be derived, where necessary, from the technology employed in the design parameters by means of which it is possible to obtain an impedance value compatible with the technological requirements and an optimisation of the transmission bandwidth. It is obvious that each type of technological solution involves a set of equations which relates the physical elements constituting the line to the corresponding electrical impedances, without it being possible to give a set of equations which is valid for all technological solutions.

Figure 2:
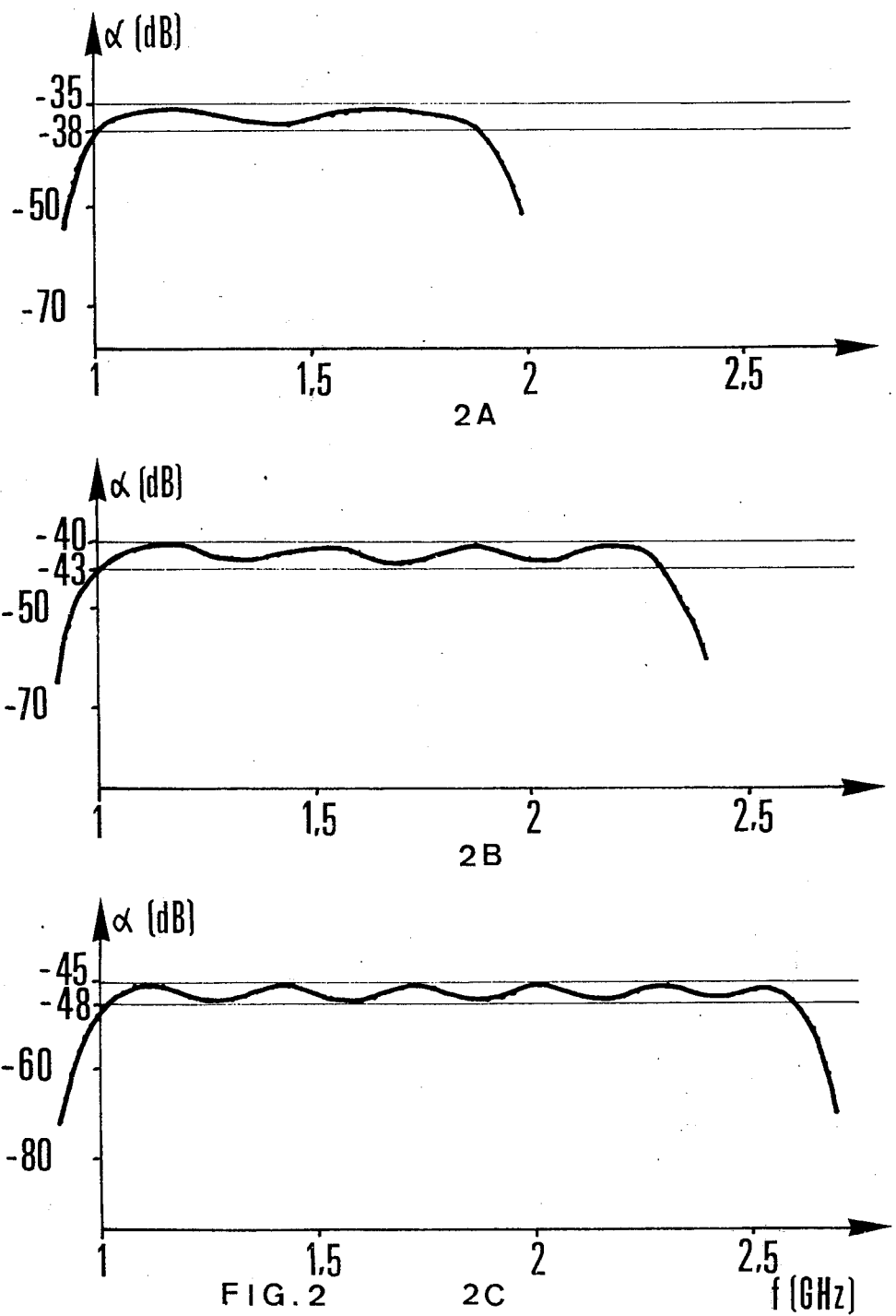

The invention will be readily understood by reference to the following description and to the accompanying figures, which are given by way of non-limiting illustration and in which:

FIG. 1 diagrammatically illustrates a delay line according to the invention comprising three pairs of transducers, and The curves of FIG. 2 illustrate the attenuation of a line having two transducers (2A), four transducers (2B) and the previous variant (2C) respectively, as a function of frequency.

There is shown at 1 in FIG. 1 the delay medium, which is generally cylindrical and which consists, for example, of corundum. Each of the ends of this material supports a set of three transducers consisting essentially of a thin-layer electrode directly deposited upon the terminal face of the delay material (in the case of corundum, this electrode generally consists of a number of successive metallic deposits, for example of chromium and gold). There is deposited upon this electrode a thin layer of piezoelectric material, generally zinc oxide, which occupies the same surface area as the electrode, and there are disposed on the surface of the piezoelectric layer three separate electrodes 4, 5 and 6 respectively, which complete the three transducers. The interconnection between these transducers and the impedance transformer is effected in the manner described in U.S. Pat. No. 3,725,826 filed on June 14, 1971 and assigned to the same assignee as the present application. The conductive strips which establish contact between the electrodes 4, 5, 6 are denoted by 7, 8, 9. These three conductive strips, which generally consist of gold, are connected for example by thermocompression, to the conductor 10 of a microstrip line supported by a substrate 11, generally of alumina, which is welded to the delay medium by way of a metallisation in electrical contact with the metallisation performing the function of a ground plane normally deposited upon the lower face of the substrate 11 of the microstrip line. The ground plane associated with the substrate connected to the end of 1 is denoted by 15. The matching section, associated with each of the transducers in such manner that the impedance introduced by this circuit at the point of contact with the line 10 behaves as a circuit resonating at the desired frequency, with a given quality factor, consists of the circuits denoted by 12, 13 and 14 respectively. Each of the circuits consists essentially of a reactive element such as 20 terminated by a metallised hole such as 12' establishing the contact with the ground plane deposited on the lower face of 11 and intended to match the impedance consisting of the capacitive impedance of each of the elemental transducers and the reactive impedance of the strips such as 7. This inductance is optionally associated with a damping resistor 7' represented by the length of strip situated between the transducer and the inductance 20. From the technological viewpoint, this inductance is constructed as a printed thick-film circuit directly deposited upon the terminal face of the delay medium 1 or upon the substrate 11, as illustrated in the figure. The line 10 is loaded by two localised capacitances 17 and 18 constructed in the form of printed-circuit line sections connected in parallel to the line 10. It performs the function of an impedance transformer between the plug 16 and the point of contact of the matching circuits. The same arrangement of elements is to be found on the lower face of the medium 1.

The curves 2A, 2B and 2C represent respectively the attenuation (insertion loss) curves of the lines constructed as described and comprising respectively 1, 2 and 3 pairs of transducers and producing a delay of 2 $\mu$s.

The attenuation of the line may be defined from the attenuations of the constituents of this line in accordance with the relation:

$$\alpha_T = \alpha_H + \alpha_{Tr} + \alpha_P + \alpha_D$$

$\alpha_H$: attenuation in the microwave circuits (reflection plus transmission).

$\alpha_{Tr}$: attenuation in the transducing means (electromagnetic energy into acoustic energy).

$\alpha_P$: propagation attenuation in the delay material.

$\alpha_D$: diffusion attenuation.

If a delay medium of sufficiently small length is employed, that is to say, in the case of short-delay lines, the attenuation term due to the diffusion $\alpha_D$ can generally be neglected. The law of variation of the term $\alpha_P$ as a function of frequency is known. It depends solely upon the material employed. Systematic measurements have been made thereon and published in literature. In the case of corundum, and in the frequency range in the neighbourhood of 1 GHz, the attenuation law is proportional to the square of the frequency. The term $\alpha_{Tr}$ depends on the one hand upon the conversion loss of the transducer and on the other hand upon on its acoustic impedance, calculated as a function of the acoustic impedance of the propagation medium. As has been stated in the foregoing, this term is related to the thickness of the piezoelectric layer. The term $\alpha_H$ depends upon the reflection which occurs at the input between the delay line and the microwave line. It therefore depends solely upon the impedances at the interconnection, as seen from the delay line side and from the transmission line side respectively. This reflection coefficient can readily be calculated. The term $\alpha_H$ also includes the ohmic losses in the matching circuit situated between the point of connection to the transmission line and the transducer. These losses may also be calculated, taking into account the design of the circuits.

What we claim:

1. An elongated acoustic delay medium having a pair of planar substrates parallel to each other and one supported at opposite ends of said medium respectively;

at least four transducers, two located on each end of said delay medium in spaced relation to each other forming at least two acoustically decoupled transducer pairs interconnected by said delay medium to convert electrical energy within a given operating frequency band into acoustic energy and vice versa;

at least four impedance matching sections, two on each substrate, each section having two electrical terminals;

a pair of stripline impedance transformers, one carried on each of said substrate respectively;

means connecting the transducers on each end of said delay medium to one end of the impedance transformer on that substrate at the same end as said transducers;

means connecting each transducer on each end of said delay medium to one terminal of a different one of said impedance matching sections on the same end as said transducers respectively;

means connecting the second terminal of each said impedance matching sections to ground; and means affording connection of electrical energy to or from the opposite end of each of said stripline impedance transformers;

the resonant frequencies of each transducer and its connected matching section being different and within the operating band.

2. A broadband microwave acoustic delay line according to claim 1 in which said matching sections are resistor - inductor circuits.

* * * * *